United States Patent
Chen et al.

(10) Patent No.: US 11,676,678 B2
(45) Date of Patent: Jun. 13, 2023

(54) DEFECT DETECTING METHOD AND DEVICE FOR WORD LINE DRIVING CIRCUIT

(71) Applicant: CHANGXIN MEMORY TECHNOLOGIES, INC., Hefei (CN)

(72) Inventors: Wugang Chen, Hefei (CN); Lung Yang, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 154 days.

(21) Appl. No.: 17/470,001

(22) Filed: Sep. 9, 2021

(65) Prior Publication Data
US 2022/0059176 A1 Feb. 24, 2022

Related U.S. Application Data

(63) Continuation of application No. PCT/CN2021/103525, filed on Jun. 30, 2021.

(30) Foreign Application Priority Data

Aug. 24, 2020 (CN) .......................... 202010858274.X (51) Int. Cl.
*G11C 29/10* (2006.01)
*G11C 29/12* (2006.01)
(Continued)

(52) U.S. Cl.
CPC ........ *G11C 29/10* (2013.01); *G11C 29/12005* (2013.01); *G11C 29/36* (2013.01);
(Continued)

(58) Field of Classification Search
CPC ... G11C 29/10; G11C 29/12005; G11C 29/36; G11C 29/4401; G11C 2029/1202; G11C 2029/1204; G11C 2029/3602
See application file for complete search history.

(56) References Cited

U.S. PATENT DOCUMENTS 5,901,096 A * 5/1999 Inokuchi ................ G11C 29/02
365/201
7,184,333 B2 2/2007 Yamada
(Continued)

FOREIGN PATENT DOCUMENTS

CN 1700356 A 11/2005
CN 1838308 B 5/2012
(Continued)

OTHER PUBLICATIONS

US 8,462,563 B2, 06/2013, Yamada (withdrawn)

*Primary Examiner* — Tuan T Nguyen
(74) *Attorney, Agent, or Firm* — Cooper Legal Group, LLC (57) ABSTRACT

A defect detecting method for a Word Line (WL) driving circuit includes: m WLs correspondingly connected to m different WL driving circuits are selected from a memory cell array and corresponding WL driving circuit arrays to serve as m WLs to be tested, one of which is set as a first WL and the remaining m-1 ones are set as second WLs; first potential is written into memory cells correspondingly connected to the m WLs to be tested; second potential is written into memory cells correspondingly connected to the first WL; real-time potentials of the memory cells connected to respective second WLs are sequentially read, and when difference value between the real-time potential of one target memory cell and the first potential is greater than first pre-set value, it is determined that the WL driving circuit connected to the second WL corresponding to the target memory cell has a defect.

20 Claims, 11 Drawing Sheets

(51) Int. Cl.
  *G11C 29/36*   (2006.01)
  *G11C 29/44*   (2006.01)
(52) U.S. Cl.
  CPC .. *G11C 29/4401* (2013.01); *G11C 2029/1202* (2013.01); *G11C 2029/1204* (2013.01); *G11C 2029/3602* (2013.01)

(56) References Cited

U.S. PATENT DOCUMENTS

| | | |
|---|---|---|
| 7,420,860 B2 | 9/2008 | Yamada |
| 8,509,006 B2 | 8/2013 | Yamada |
| 8,891,325 B2 | 11/2014 | Choi |
| 9,455,049 B2 | 9/2016 | Lee et al. |
| 9,502,126 B1 | 11/2016 | Kim |
| 2004/0001375 A1* | 1/2004 | Beer ............... G11C 29/36 365/200 |
| 2005/0278592 A1 | 12/2005 | Yamada |
| 2007/0147146 A1 | 6/2007 | Yamada |
| 2011/0194360 A1 | 8/2011 | Yamada |
| 2013/0215697 A1 | 8/2013 | Choi |
| 2014/0241076 A1* | 8/2014 | Kwon ............... G11C 29/18 365/201 |
| 2016/0180965 A1 | 6/2016 | Lee et al. |
| 2017/0092378 A1* | 3/2017 | Tanaka ......... G11C 29/50016 |
| 2021/0193213 A1 | 6/2021 | Jeong et al. |

FOREIGN PATENT DOCUMENTS

| | | |
|---|---|---|
| CN | 102142283 B | 3/2013 |
| CN | 106531205 A | 3/2017 |
| CN | 113012734 A | 6/2021 |

* cited by examiner

DEFECT DETECTING METHOD AND DEVICE FOR WORD LINE DRIVING CIRCUIT

CROSS-REFERENCE TO RELATED APPLICATIONS

This application is a continuation of International Application No. PCT/CN2021/103525, filed on Jun. 30, 2021, which claims priority to Chinese patent application No. 202010858274.X, filed on Aug. 24, 2020. The disclosures of International Application No. PCT/CN2021/103525 and Chinese patent application No. 202010858274.X are hereby incorporated by reference in their entireties.

TECHNICAL FIELD

The disclosure relates to the technical field of semiconductor manufacturing, and exemplarily relates to a defect detecting method and device for a Word Line (WL).

BACKGROUND

In a Dynamic Random Access Memory (DRAM), as its small critical dimension, Poly-Gate necking is easily caused. In a WL driving circuit, the Poly-Gate necking will cause resistance to increase and a storage signal to become weak or distort. After an aging process, the Poly-Gate necking will further be aggravated (the resistance is further increased or disconnection is caused), so that the chip yield is caused to decrease. Therefore, a method capable of detecting the Poly-Gate necking in the WL driving circuit is urgently needed.

It is to be noted that information disclosed in the above background part is merely used for enhancing understanding of the disclosed background, so that information, which does not constitute the conventional art known by those of ordinary skill in the art, may be included.

SUMMARY

The embodiments of the disclosure provide a defect detecting method and device for a WL driving circuit, for overcoming, to a certain degree, the problem that WL driving circuit defects cannot be tested due to limitations and defects of related technologies.

According to a first aspect of the embodiments of the disclosure, a defect detecting method for a WL driving circuit is provided, which may include: from a memory cell array and WL driving circuit arrays corresponding to the memory cell array, m WLs are selected to serve as m WLs to be tested, one of the m WLs to be tested is set as a first WL, the remaining m−1 WLs to be tested are set as second WLs, herein, the m WLs to be tested are respectively and correspondingly connected to m different WL driving circuits, and m is an integer greater than 1; a first write operation that a first potential is written into memory cells correspondingly connected to all transistors controlled by the m WLs to be tested; a second write operation that a second potential is written into memory cells correspondingly connected to all transistors controlled by the first WL; and a read and determination operation that real-time potentials of memory cells correspondingly connected to all transistors controlled by respective second WLs are read in sequence, and when a difference value between a read real-time potential of a target memory cell and the first potential is greater than a first pre-set value, it is determined that the WL driving circuit connected to the second WL correspondingly connected to the transistor correspondingly connected to the target memory cell has a defect, herein, a difference value between the first potential and the second potential is greater than or equal to 0.6 V.

According to a second aspect of the embodiments of the disclosure, a defect detecting device for a WL driving circuit is provided, which may include a memory storing processor-executable instructions; and a processor configured to execute the stored processor-executable instructions to perform operations of: selecting m WLs from a memory cell array and WL driving circuit arrays corresponding to the memory cell array to serve as m WLs to be tested, setting one of the m WLs to be tested as a first WL, and setting the remaining m−1 WLs to be tested as second WLs, wherein the m WLs to be tested are respectively and correspondingly connected to m different WL driving circuits, where m is an integer greater than 1; a first write operation of writing a first potential into memory cells correspondingly connected to all transistors controlled by the m WLs to be tested; a second write operation of writing a second potential into memory cells correspondingly connected to all transistors controlled by the first WL; and a read and determination operation of sequentially reading real-time potentials of memory cells correspondingly connected to all transistors controlled by respective second WLs, and when a difference value between a read real-time potential of a target memory cell and the first potential is greater than a first pre-set value, determining that the WL driving circuit connected to the second WL correspondingly connected to the transistor correspondingly connected to the target memory cell has a defect, where a difference value between the first potential and the second potential is greater than or equal to 0.6 V.

It is to be understood that the above general descriptions and detail descriptions below are merely exemplary and explanatory, which may not limit the disclosure.

BRIEF DESCRIPTION OF THE DRAWINGS

The drawings, which are incorporated in and constitute a part of this specification, illustrate embodiments consistent with the disclosure and, together with the description, serve to explain the principles of the disclosure. It is apparent that the drawings described below are only some embodiments of the disclosure. Other drawings may further be obtained by those of ordinary skilled in the art according to these drawings without creative work.

DETAILED DESCRIPTION

Exemplary implementations are described more comprehensively with reference to the drawings at present. However, the exemplary implementations may be implemented in many forms, and should not be understood as limitation to examples described here. On the contrary, these provided implementations enable the disclosure to be more comprehensive and complete, and conceptions of the exemplary implementations are comprehensively conveyed to those skilled in the art. The described features, structures or features may be combined in one or more implementations in any proper manner. In the descriptions below, many specific details are provided to give a full understanding of the implementations of the disclosure. However, those skilled in the art will realize that: the technical solutions of the disclosure may be practiced and one or more of the specific details are omitted, or other methods, components, devices, steps and the like may be adopted. In other cases, the known technical solutions are not illustrated or described in detail to avoid a reversal of the order of host and guest, which results in that various aspects of the disclosure become blurred.

Moreover, the drawings are merely schematic diagrams of the disclosure, and same drawing signs in the figure represent same or similar parts, so that repetitive descriptions of them are omitted. Some block diagrams shown in the drawings are functional entities, and do not necessarily correspond to physically or logically independent entities. These functional entities may be realized in a software form, or these functional entities may be realized in one or more hardware modules or integrated circuits, or these functional entities may be realized in different networks and/or processor devices and/or micro-controller devices.

The exemplary implementations of the disclosure will be described in detail below in combination with the drawings.

Figure 1A:
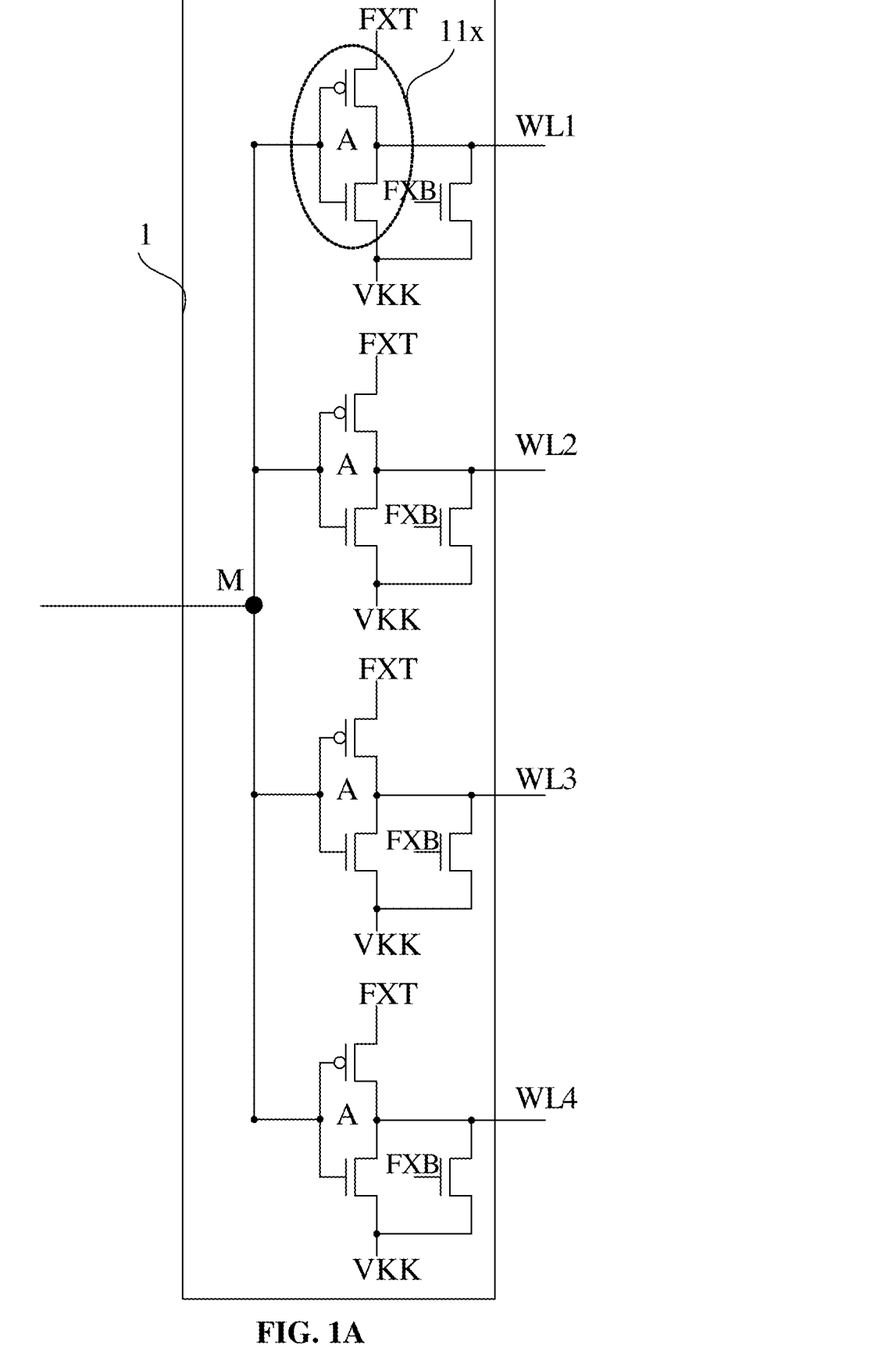
FIG. 1A is a schematic diagram of a WL driving circuit.
Figure 1B:
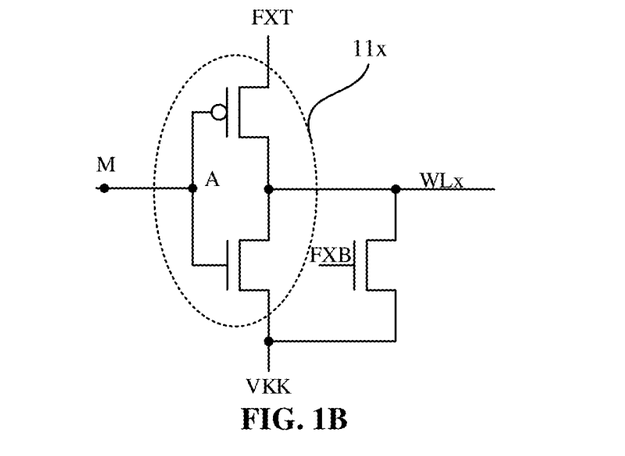
FIG. 1B is a schematic diagram of a circuit of a phase inverter in a WL driving circuit.
Figure 1C:
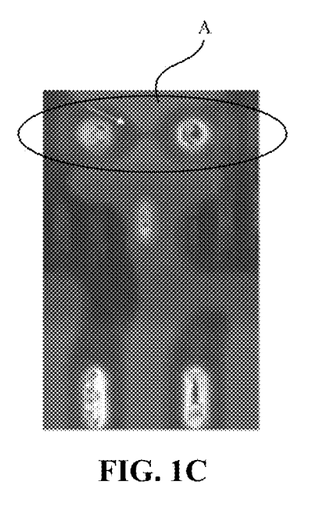
FIG. 1C is a photo of Poly-Gate necking at a position A in FIG. 1A and FIG. 1B.

FIG. 1A to FIG. 1C are schematic diagrams of Poly-Gate necking of a WL driving circuit.

Referring to FIG. 1A, a WL driving circuit 1 is connected to n WLs through n phase inverter circuits 11, and a gate of a transistor in each of the phase inverters 11 is connected to a control node M of the WL driving circuit 1. A circuit of each of the phase inverters 11 is as shown in FIG. 1B.

When a gate (at a position A in the figure) of a transistor corresponding to any phase inverter $11x$ (x is a serial number of a phase inverter or a serial number of a WL) has Poly-Gate necking (gate necking or disconnection) as shown in FIG. 1C, the resistance of the phase inverter $11x$ increases, at this time, a WL control instruction output by a read-write controller through the control node M may not accurately reach a WLx, which results in anomaly in control of the WLx.

Figure 2:
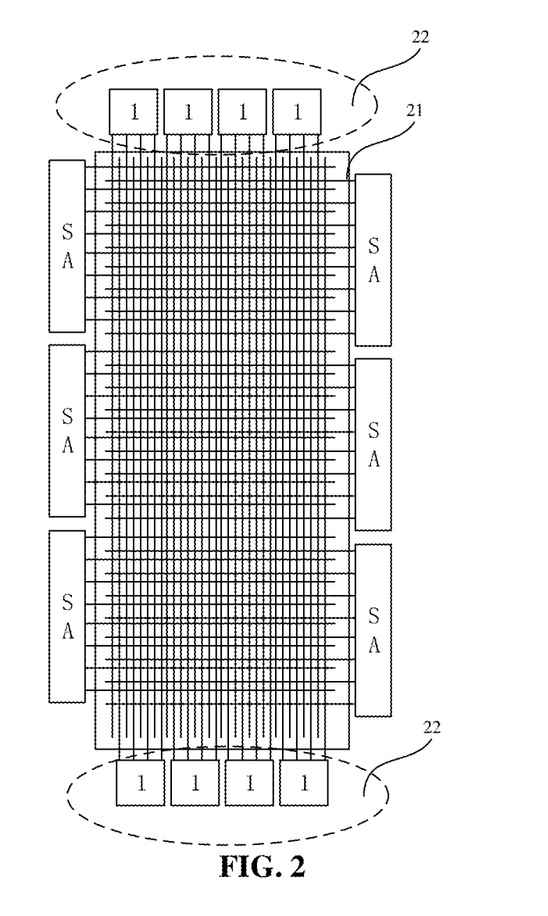
FIG. 2 is a schematic diagram of a memory cell array and WL driving circuits corresponding to the memory cell array.

FIG. 2 is a schematic diagram of a memory cell array and corresponding WL driving circuits.

Referring to FIG. 2, a memory cell array 21 is in the center, and may include a number N1 of rows and a number N2 of columns, namely N1*N2 memory cells (not shown in the figure), and each of the memory cells is located at an intersection of a WL connected to one WL driving circuit 1 and a Bit Line (BL) connected to one Sense Amplifier (SA).

WL driving circuit arrays 22 are respectively located on two sides of the memory cell array 21, each of the WL driving circuit arrays 22 may include multiple WL driving circuits 1, each of the WL driving circuits 1 is connected to n WLs, multiple WLs in the memory cell array are arranged in parallel and in an interdigitated manner, and the WL driving circuits 1 correspondingly connected to adjacent WLs are respectively in the WL driving circuit arrays 22 on different sides of the memory cell array. In an embodiment, the WL driving circuit array 22 on one side may totally include 16 WL driving circuits 1, each WL driving circuit 1 corresponding to 4 WLs. Namely, the memory cell array 21 may totally include 16*2*4=128 WLs, namely N2=128. At this time, the number of WLs to be tested selected each time may be the number 16 of the WL driving circuits on one side, namely m=16.

It is to be understood that a memory may include multiple memory cell arrays 21 and WL driving circuit arrays 22 corresponding to respective memory cell arrays, which is not elaborated herein. In an embodiment, one page of the memory may include 8 memory cell arrays 21, and the number of the corresponding WLs is totally 2048.

Figure 3:
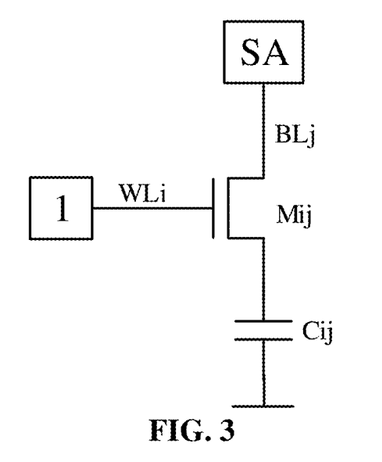
FIG. 3 is a schematic diagram showing a relationship between a memory cell and a WL driving circuit.

FIG. 3 is a schematic diagram showing a relationship between a memory cell and a WL driving circuit.

Referring to FIG. 3, in the memory cell array 21, two adjacent WLs respectively correspond to the WL driving circuits 1 on different sides. Each WLi controls a number N1 of transistors Mij, a first end of the transistor Mij is connected to one memory cell Cij, a second end of the transistor Mij is connected to a BLj, herein, i is a serial number of a WL, and j is a serial number of a BL.

In order to detect Poly-Gate necking of the WL driving circuit as shown in FIG. 1A to FIG. 1C, the disclosure provides a defect detecting method for a WL driving circuit.

Figure 4:
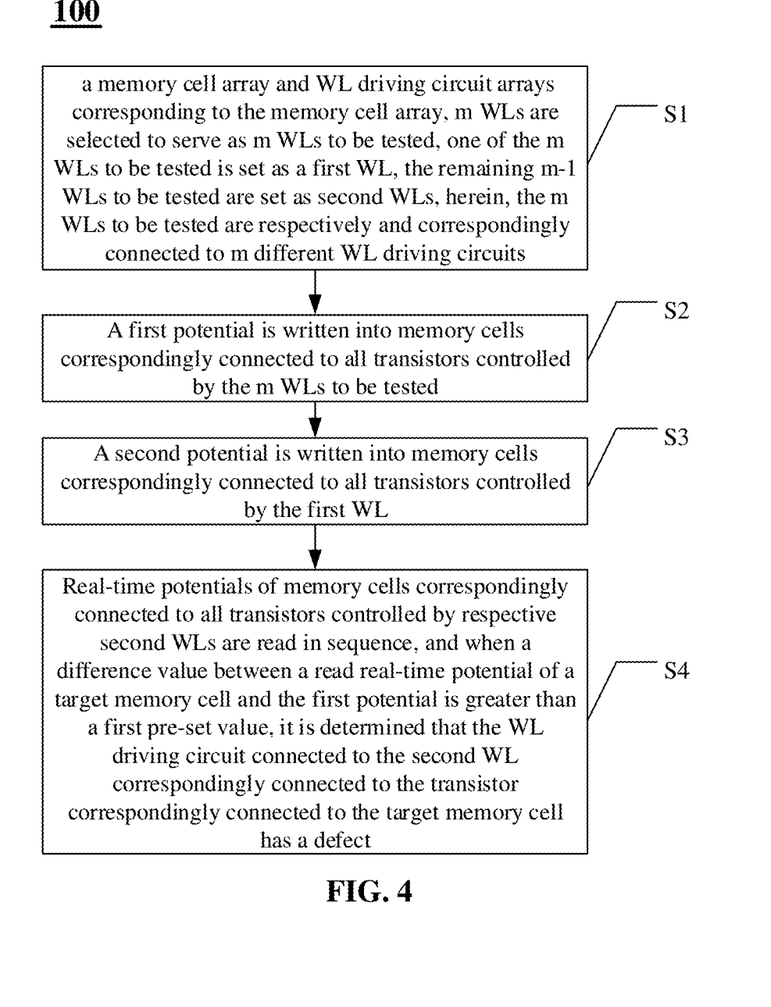
FIG. 4 is a flowchart of a defect detecting method for a WL driving circuit according to an exemplary embodiment of the disclosure.

FIG. 4 is a flowchart of a defect detecting method for a WL driving circuit according to an exemplary embodiment of the disclosure.

Referring to FIG. 4, a defect detecting method for a WL driving circuit 100 may include the following operations.

At S1, from a memory cell array and WL driving circuit arrays corresponding to the memory cell array, m WLs are selected to serve as m WLs to be tested, one of the m WLs to be tested is set as a first WL, the remaining m−1 WLs to be tested are set as second WLs, herein, the m WLs to be tested are respectively and correspondingly connected to m different WL driving circuits, where m is an integer greater than 1.

At S2, a first potential is written into memory cells correspondingly connected to all transistors controlled by the m WLs to be tested.

At S3, a second potential is written into memory cells correspondingly connected to all transistors controlled by the first WL.

At S4, real-time potentials of memory cells correspondingly connected to all transistors controlled by respective second WLs are read in sequence, and when a difference value between a read real-time potential of a target memory cell and the first potential is greater than a first pre-set value, it is determined that the WL driving circuit connected to the second WL correspondingly connected to the transistor correspondingly connected to the target memory cell has a defect, herein, a difference value between the first potential and the second potential is greater than or equal to 0.6 V.

According to the embodiments of the disclosure, by selecting the m WLs to be tested respectively corresponding to the m WL driving circuits, the first potential is written into all the memory cells corresponding to the m WLs to be tested at first, and then, the second potential is written into the memory cell corresponding to one WL to be tested, thus the memory cell corresponding to the WL to be tested corresponding to the WL driving circuit having a defect is enabled to generate a real-time potential between the first potential and the second potential. In this way, the WL driving circuit having the defect is identified by reading real-time potentials of the memory cells corresponding to other WLs to be tested.

Various steps of the defect detecting method for a WL driving circuit 100 will be described in detail below.

At S1, in the memory cell array and the WL driving circuit arrays corresponding to the memory cell array, the m WLs are selected to serve as the WLs to be tested, one of the m WLs to be tested is set as the first WL, the remaining m−1 WLs to be tested are set as the second WLs, herein, the m WLs to be tested are respectively and correspondingly connected to the m different WL driving circuits, and m is an integer greater than 1.

Firstly, m WLs may be selected to serve as the WLs to be tested from one memory cell array 21 to be tested and WL driving circuit arrays 22 corresponding to the memory cell array. In order to detect Poly-Gate necking of the WL driving circuit, the m WLs to be tested respectively correspond to m different WL driving circuits.

Figure 5:
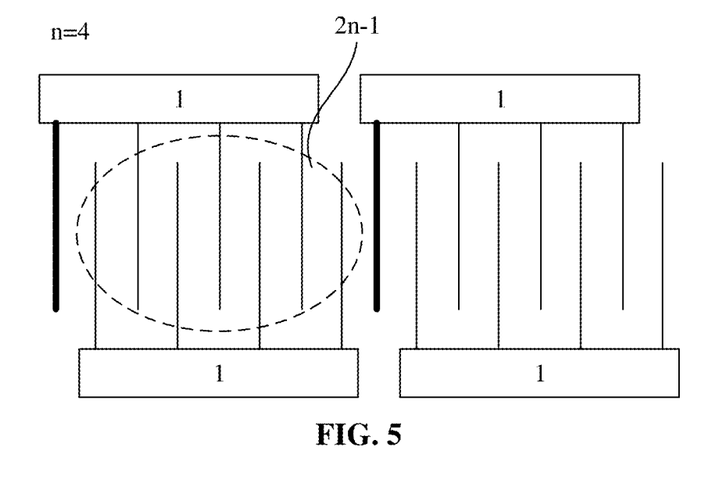
FIG. 5 is a schematic diagram showing selection positions for WLs to be tested according to an exemplary embodiment of the disclosure.

FIG. 5 is a schematic diagram showing selection positions for WLs to be tested according to an exemplary embodiment of the disclosure.

Referring to FIG. 5, in an embodiment, the m WL driving circuits may be arranged in the WL driving circuit array 22 on a same side of the memory cell array. As each of the WL driving circuits is connected to n WLs and adjacent WLs in the memory cell array 21 respectively correspond to the WL driving circuit arrays 22 on different sides, at this time, m WLs to be tested (bolded in FIG. 5) may be selected in such a way that 2n−1 WLs are interposed between two immediately adjacent selected WLs to be tested.

At S2, the first potential is written into the memory cells correspondingly connected to all the transistors controlled by the m WLs to be tested.

Figure 6:
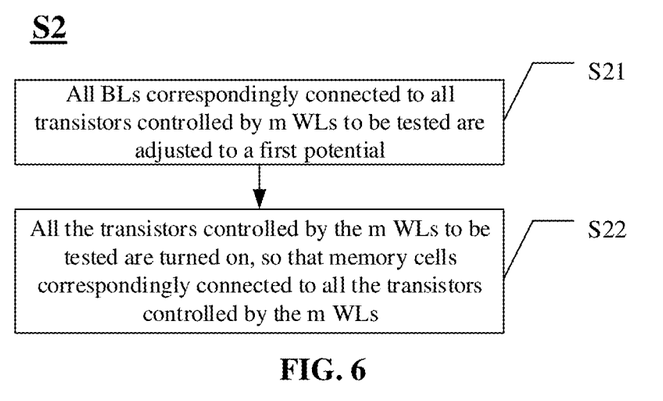
FIG. 6 is a sub-flowchart of S2 according to an embodiment.

FIG. 6 is a sub-flowchart of a step S2 according to an embodiment.

Referring to FIG. 6, S2 may include the following operations.

At S21, all BLs correspondingly connected to all the transistors controlled by the m WLs to be tested are adjusted to the first potential.

At S22, all the transistors controlled by the m WLs to be tested are turned on, so that the first potential is written into the memory cells correspondingly connected to all the transistors controlled by the m WLs to be tested.

Herein, the operation that all the transistors controlled by a WL to be tested are turned on means that a first storage control instruction is output to the WL to be tested through the WL driving circuit corresponding to the WL to be tested, and the operation that all the transistors controlled by a WL to be tested are turned off means that a second storage control instruction is output to the WL to be tested through the WL driving circuit corresponding to the WL to be tested.

Implementation of the S2 aims to control, the memory cells corresponding to all the WLs to be tested, to be in the same initial potential, thereby providing determination basis for subsequent test.

At S3, the second potential is written into the memory cells correspondingly connected to all transistors controlled by the first WL.

Figure 7:
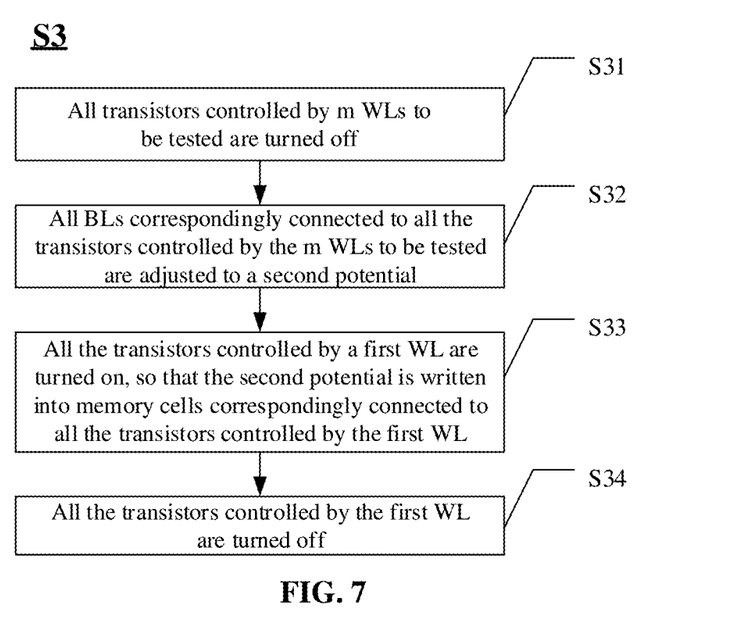
FIG. 7 is a sub-flowchart of S3 according to an embodiment.

FIG. 7 is a sub-flowchart of a step S3 according to an embodiment.

Referring to FIG. 7, S3 may include the following operations.

At S31, all the transistors controlled by the m WLs to be tested are turned off.

At S32, all the BLs correspondingly connected to all the transistors controlled by the m WLs to be tested are adjusted to the second potential.

At S33, all the transistors controlled by the first WL are turned on, so that the second potential is written into the memory cells correspondingly connected to all the transistors controlled by the first WL.

At S34, all the transistors controlled by the first WL are turned off.

If a second WL corresponds to a WL driving circuit having Poly-Gate necking, due to existence of the Poly-Gate necking in the WL driving circuit, the first storage control instruction and the second storage control instruction for controlling the second WL will be weakened or delayed, which results in that: when S32 is performed, the transistors controlled by the second WL cannot be turned off in time, and storage states of the memory cells connected to these transistors are between the first potential and the second potential, due to being influenced by the second potential on the BL.

At S4, real-time potentials of memory cells correspondingly connected to all transistors controlled by respective second WLs are read in sequence, and when a difference value between a read real-time potential of a target memory cell and the first potential is greater than a first pre-set value, it is determined that the WL driving circuit connected to the second WL correspondingly connected to the transistor correspondingly connected to the target memory cell has a defect, herein, a difference value between the first potential and the second potential is greater than or equal to 0.6 V.

In order to increase the probability of successful detection and increase the storage state anomaly ratio of the memory cell corresponding to the WL driving circuit having Poly-Gate necking, the difference value between the first potential and the second potential is controlled to be greater than or equal to 0.6 V. In an embodiment, the first potential may be set as −0.1 V to 0.2 V, the second potential may be set as 0.8 V to 1.1 V, or, the first potential may be set as 0.8 V to 1.1 V, the second potential may be set as −0.1 V to 0.2 V. In an embodiment, for example, the first pre-set value may be equal to 0.5 V.

The operation that the real-time potentials of memory cells correspondingly connected to all transistors controlled by respective second WLs are read in sequence may be as follows: a second WL is selected, the real-time potentials of the memory cells correspondingly connected to all the transistors controlled by the second WL are read and determined, and a second WL is continuously selected till the real-time potentials of the memory cells correspondingly connected to all the transistors controlled by all the second WLs are read and determined.

As described in S3, by being influenced by the weakened or delayed storage control instruction and the BL in the second potential, the storage state of the memory cell corresponding to the second WL corresponding to the WL driving circuit having Poly-Gate necking will be between the first potential and the second potential. At this time, whether the storage state of the memory cell is abnormal may be determined by determining whether the difference value between the real-time potential of each memory cell and the first potential is greater than the first pre-set value, so that it is determined that the WL driving circuit corresponding to the second WL corresponding to the target memory cell has Poly-Gate necking when the real-time potential of the target memory cell is not close to the first potential.

In other embodiments, whether the storage state of the memory cell is abnormal may be determined also by determining whether the difference value between the real-time potential of each memory cell and the second potential is less than a second pre-set value. When the difference value between the real-time potential of each memory cell and the second potential is less than the second pre-set value, that is, the real-time potential of the target memory cell is closer to the second potential, it is determined that the WL driving circuit corresponding to the second WL corresponding to the target memory cell has Poly-Gate necking.

Both the first pre-set value and the second pre-set value may be set by those skilled in the art according to the difference value between the first potential and the second potential, which is not specially limited by the disclosure.

After S4, testing of all the WLs may be realized by setting cycle test.

In an embodiment, the operation that 2 m*n continuously arranged WLs may be selected from the memory cell array to serve as a test group to be tested may include: the m WLs to be tested are sequentially selected from the test group according to the arrangement sequence of the WLs, one of the m WLs to be tested is sequentially set according to the arrangement sequence of the WLs as the first WL, and then the first write operation (S2), the second write operation (S3) and the read and determination operation (S4) are performed till each of the 2 m*n WLs has been set as the first WL. Afterwards, in the memory cell array, every 2 m*n continuously arranged WLs are sequentially selected according to the arrangement sequence of the WLs to serve as a test group, and then the test group is tested till all the WLs in the memory cell array have been selected into the test group.

For example, if the serial number of a WL j corresponding to a WL driving circuit i is WLij, the serial numbers of the WL driving circuits on two sides of the memory cell array are 1, 3, 5, 7 and 2, 4, 6, 8 respectively, and each WL driving circuit corresponds to 4 WLs. At first, the WL11, the WL31, the WL51 and the WL71 may be selected to serve as the WLs to be tested in S1, the WL11 is set as the first WL, and the WL31, the WL51 and the WL71 are set as the second WLs. After the first potential is written into all the memory cells connected to all the transistors controlled by the WL11, the WL31, the WL51 and the WL71, the second potential is written into all the memory cells connected to all transistors controlled by the WL11, the real-time potentials of the memory cells connected to all the transistors controlled by the WL31, the WL51 and the WL71 are read in sequence, so that whether the WL driving circuits 1, 3, 5 and 7 have Poly-Gate necking or not is determined.

Then, selection sequences below are performed to implement the cycle test.

The WL21, the WL41, the WL61 and the WL81 are selected to serve as the WLs to be tested, the WL21 is set as the first WL, and the WL41, the WL61 and the WL81 are set as the second WLs for testing.

The WL12, the WL32, the WL52 and the WL72 are selected to serve as the WLs to be tested, the WL12 is set as the first WL, and the WL32, the WL52 and the WL72 are set as the second WLs for testing.

The WL22, the WL42, the WL62 and the WL82 are selected to serve as the WLs to be tested, the WL22 is set as the first WL, and the WL42, the WL62 and the WL82 are set as the second WLs for testing.

The WL13, the WL33, the WL53 and the WL73 are selected to serve as the WLs to be tested, the WL13 is set as the first WL, and the WL33, the WL53 and the WL73 are set as the second WLs for testing.

The WL23, the WL43, the WL63 and the WL83 are selected to serve as the WLs to be tested, the WL23 is set as the first WL, and the WL43, the WL63 and the WL83 are set as the second WLs for testing.

The WL14, the WL34, the WL54 and the WL74 are selected to serve as the WLs to be tested, the WL14 is set as the first WL, and the WL34, the WL54 and the WL74 are set as the second WLs for testing.

The WL24, the WL44, the WL64 and the WL84 are selected to serve as the WLs to be tested, the WL24 is set as the first WL, and the WL44, the WL64 and the WL84 are set as the second WLs for testing.

Then, the above selection process is repeated, and the WL31, the WL41, the WL32, the WL42, the WL33, the WL43, the WL34 and the WL44 are set as the first WLs sequentially for testing. The above cycle logic is repeated till each BL to be tested has been set as the first WL to participate in test.

In another embodiment, testing of all the WLs in the memory cell array may be implemented also by setting other cycle modes.

Figure 8:
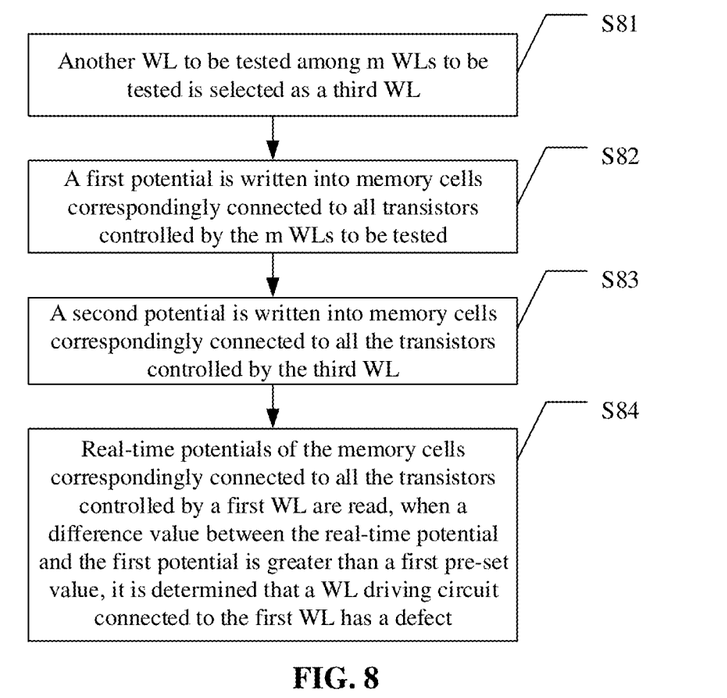
FIG. 8 is a schematic flowchart of another embodiment of the disclosure.

FIG. 8 is a schematic flowchart of another embodiment of the disclosure.

After all the memory cells corresponding to the m−1 second WLs are read, phase inverters in the m−1 WL driving circuits corresponding to the m WLs to be tested selected at this time have been tested. At this time, the WL driving circuit corresponding to the WL to be tested serving as the first WL hasn't been tested yet. Therefore, referring to FIG. 8, in an embodiment, the method may also include the following operations.

At S81, another WL to be tested among the m WLs to be tested is selected as a third WL.

At S82, a first potential is written into memory cells correspondingly connected to all transistors controlled by the m WLs to be tested.

At S83, a second potential is written into memory cells correspondingly connected to all transistors controlled by the third WL.

At S84, real-time potentials of the memory cells correspondingly connected to all the transistors controlled by the first WL are read, and when a difference value between the real-time potential and the first potential is greater than a first pre-set value, it is determined that the WL driving circuit connected to the first WL has a defect.

As the third WL is selected and the on-off state of the transistor connected to the first WL and the on-off state of the transistor connected to the third WL are opposite, the WL driving circuit connected to the first WL may be tested, so that all m WL driving circuits corresponding to m WLs to be tested selected at this time are tested.

In another embodiment, each of the m WLs to be tested selected at this time may also be sequentially set as the first WL for testing, that is, the group of m WLs to be tested is tested for m times totally, so that it is possible to increase the probability of screening out Poly-Gate necking of the WL driving circuits corresponding to the various WLs to be tested.

After the m WLs to be tested selected at this time have been tested, m WLs to be tested may be continuously selected from the memory cell array and the WL driving circuit arrays corresponding to the memory cell array for testing till all the WLs in the memory cells to be tested have been selected as the WLs to be tested.

After the current memory cell array and the WL driving circuit arrays corresponding to the memory cell array have been tested, testing may be performed on other memory cell arrays and WL driving circuit arrays corresponding to respective memory cell arrays till testing of the WL driving circuits in the whole memory is completed.

Figure 9:
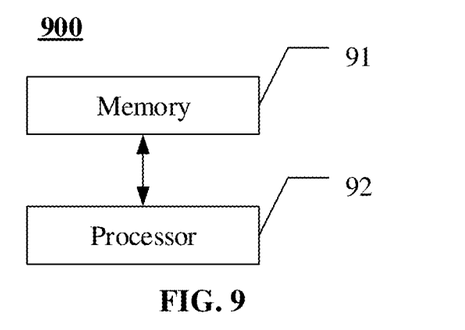
FIG. 9 is a block diagram of a defect detecting device for a WL driving circuit provided according to an embodiment of the disclosure.

FIG. 9 is a block diagram of a defect detecting device for a WL driving circuit provided according to an embodiment of the disclosure.

Referring to FIG. 9, a defect detecting device 900 for a WL driving circuit may include:
a memory 91;
a processor 92 coupled to the memory 91, and configured to execute any of the above defect detecting methods for a WL driving circuit based on an instruction stored in the memory 91.

Functions executed by the defect detecting device 900 have been described in detail in the embodiments of the corresponding method, which are not elaborated herein.

It is to be noted that although multiple modules or units of an apparatus for action execution are mentioned in the foregoing detailed descriptions, but this division is not mandatory. Actually, according to the implementations of the disclosure, the foregoing described features and functions of two or more modules or units may be embodied in a module or unit. On the contrary, the foregoing described features and functions of a module or unit may further be embodied by multiple modules or units.

Moreover, the drawings are merely schematic descriptions of processes included in the methods according to the exemplary embodiments of the disclosure, but not for limitation. It is to be easily understood that the processes shown in the drawings do not show or limit the time sequence of these processes. Moreover, it is also to be easily understood that these processes may be executed synchronously or asynchronously in plurality of modules.

After considering the specification and practicing the disclosure here, those skilled in the art will easily thick about other implementation schemes of the disclosure. The application aims to contain any modification, purpose or adaptive change of the disclosure, and these modifications, purposes or adaptive changes follow general principles of the disclosure and may include common general knowledge or conventional technical means in the technical field, which is not disclosed by the disclosure. The description and the embodiments are merely exemplary, and the real scope and conception of the disclosure are pointed out by claims.

INDUSTRIAL APPLICABILITY

According to the embodiments of the disclosure, by selecting m WLs to be tested respectively corresponding to m WL driving circuits, a first potential is written into all memory cells corresponding to the m WLs to be tested at first, and then, a second potential is written into the memory cell corresponding to one WL to be tested, thus the memory cell corresponding to the WL to be tested corresponding to the WL driving circuit having a defect is enabled to generate a real-time potential between the first potential and the second potential. In this way, the WL driving circuit having a defect is identified by reading real-time potentials of the memory cells corresponding to other WLs to be tested.

The invention claimed is:

1. A defect detecting method for a Word Line (WL) driving circuit, comprising:
selecting m WLs from a memory cell array and WL driving circuit arrays corresponding to the memory cell array to serve as m WLs to be tested, setting one of the m WLs to be tested as a first WL, and setting the remaining m−1 WLs to be tested as second WLs, wherein the m WLs to be tested are respectively and correspondingly connected to m different WL driving circuits, where m is an integer greater than 1;
a first write operation of writing a first potential into memory cells correspondingly connected to all transistors controlled by the m WLs to be tested;
a second write operation of writing a second potential into memory cells correspondingly connected to all transistors controlled by the first WL; and
a read and determination operation of sequentially reading real-time potentials of memory cells correspondingly connected to all transistors controlled by respective second WLs, and when a difference value between a read real-time potential of a target memory cell and the first potential is greater than a first pre-set value, determining that the WL driving circuit connected to the second WL correspondingly connected to the transistor correspondingly connected to the target memory cell has a defect,
wherein a difference value between the first potential and the second potential is greater than or equal to 0.6 V.

2. The defect detecting method for a WL driving circuit of claim 1, wherein the WL driving circuit arrays are located on two sides of the memory cell array, the multiple WLs in the memory cell array are arranged in parallel and in an interdigitated manner, and the WL driving circuits correspondingly connected to adjacent WLs are respectively in the WL driving circuit arrays on different sides of the memory cell array.

3. The defect detecting method for a WL driving circuit of claim 2, wherein m WL driving circuits correspondingly connected to the m WLs to be tested are in the WL driving circuit array on a same side of the memory cell array.

4. The defect detecting method for a WL driving circuit of claim 3, wherein selecting the m WLs to serve as the WLs to be tested comprises:
sequentially selecting the m WLs to be tested in the memory cell array in such a way that 2n−1 WLs are interposed between two immediately adjacent selected WLs to be tested, wherein n is a number of the WLs connected to the WL driving circuit, and n is a positive integer.

5. The defect detecting method for a WL driving circuit of claim 1, wherein writing the first potential into the memory cells correspondingly connected to all the transistors controlled by the m WLs comprises:
adjusting all Bit Lines (BLs) correspondingly connected to all the transistors controlled by the m WLs to be tested to the first potential; and
turning on all the transistors controlled by the m WLs to be tested, so that the first potential is written into the memory cells correspondingly connected to all the transistors controlled by the m WLs to be tested.

6. The defect detecting method for a WL driving circuit of claim 5, wherein writing the second potential into the memory cells correspondingly connected to all the transistors controlled by the first WL comprises:
turning off all the transistors controlled by the m WLs to be tested;

adjusting all the BLs correspondingly connected to all the transistors controlled by the m WLs to be tested to the second potential;

turning on all the transistors controlled by the first WL, so that the second potential is written into the memory cells correspondingly connected to all the transistors controlled by the first WL; and turning off all the transistors controlled by the first WL.

7. The defect detecting method for a WL driving circuit of claim 1, wherein the first potential is −0.1 V to 0.2 V and the second potential is 0.8 V to 1.1 V, or, the first potential is 0.8 V to 1.1 V and the second potential is −0.1 V to 0.2 V, and wherein the first pre-set value is equal to 0.5 V.

8. The defect detecting method for a WL driving circuit of claim 4, further comprising:

selecting 2 m*n continuously arranged WLs from the memory cell array to serve as a test group to be tested, and testing the test group to be tested, which comprises: sequentially selecting the m WLs to be tested from the test group according to an arrangement sequence of the WLs, sequentially setting one of the m WLs to be tested as the first WL according to the arrangement sequence of the WLs, and then performing the first write operation, the second write operation and the read and determination operation till each of the 2 m*n WLs has been set as the first WL.

9. The defect detecting method for a WL driving circuit of claim 8, further comprising:

sequentially selecting every 2 m*n continuously arranged WLs from the memory cell array according to the arrangement sequence of the WLs to serve as the test group, and then testing the test group till all the WLs in the memory cell array have been selected into the test group.

10. The defect detecting method for a WL driving circuit of claim 4, wherein the number m of the selected WLs to be tested is 16, and the number n of the WLs correspondingly connected to each WL driving circuit is 4.

11. A defect detecting device for a Word Line (WL) driving circuit, comprising:

a memory storing processor-executable instructions; and a processor configured to execute the processor-executable instructions to perform operations of:

selecting m WLs from a memory cell array and WL driving circuit arrays corresponding to the memory cell array to serve as m WLs to be tested, setting one of the m WLs to be tested as a first WL, and setting the remaining m−1 WLs to be tested as second WLs, wherein the m WLs to be tested are respectively and correspondingly connected to m different WL driving circuits, where m is an integer greater than 1;

a first write operation of writing a first potential into memory cells correspondingly connected to all transistors controlled by the m WLs to be tested;

a second write operation of writing a second potential into memory cells correspondingly connected to all transistors controlled by the first WL; and a read and determination operation of sequentially reading real-time potentials of memory cells correspondingly connected to all transistors controlled by respective second WLs, and when a difference value between a read real-time potential of a target memory cell and the first potential is greater than a first pre-set value, determining that the WL driving circuit connected to the second WL correspondingly connected to the transistor correspondingly connected to the target memory cell has a defect, wherein a difference value between the first potential and the second potential is greater than or equal to 0.6 V.

12. The defect detecting device for a WL driving circuit of claim 11, wherein the WL driving circuit arrays are located on two sides of the memory cell array, the multiple WLs in the memory cell array are arranged in parallel and in an interdigitated manner, and the WL driving circuits correspondingly connected to adjacent WLs are respectively in the WL driving circuit arrays on different sides of the memory cell array.

13. The defect detecting device for a WL driving circuit of claim 12, wherein m WL driving circuits correspondingly connected to the m WLs to be tested are in the WL driving circuit array on a same side of the memory cell array.

14. The defect detecting device for a WL driving circuit of claim 13, wherein selecting the m WLs to serve as the WLs to be tested comprises:

sequentially selecting the m WLs to be tested in the memory cell array in such a way that 2n−1 WLs are interposed between two immediately adjacent selected WLs to be tested, wherein n is a number of the WLs connected to the WL driving circuit, and n is a positive integer.

15. The defect detecting device for a WL driving circuit of claim 11, wherein writing the first potential into the memory cells correspondingly connected to all the transistors controlled by the m WLs comprises:

adjusting all Bit Lines (BLs) correspondingly connected to all the transistors controlled by the m WLs to be tested to the first potential; and turning on all the transistors controlled by the m WLs to be tested, so that the first potential is written into the memory cells correspondingly connected to all the transistors controlled by the m WLs to be tested.

16. The defect detecting device for a WL driving circuit of claim 15, wherein writing the second potential into the memory cells correspondingly connected to all the transistors controlled by the first WL comprises:

turning off all the transistors controlled by the m WLs to be tested;

adjusting all the BLs correspondingly connected to all the transistors controlled by the m WLs to be tested to the second potential;

turning on all the transistors controlled by the first WL, so that the second potential is written into the memory cells correspondingly connected to all the transistors controlled by the first WL; and turning off all the transistors controlled by the first WL.

17. The defect detecting device for a WL driving circuit of claim 11, wherein the first potential is −0.1 V to 0.2 V and the second potential is 0.8 V to 1.1 V, or, the first potential is 0.8 V to 1.1 V and the second potential is −0.1 V to 0.2 V, and wherein the first pre-set value is equal to 0.5 V.

18. The defect detecting device for a WL driving circuit of claim 14, wherein the processor is configured to execute the processor-executable instructions to further perform operations of:

selecting 2 m*n continuously arranged WLs from the memory cell array to serve as a test group to be tested, and testing the test group to be tested, which comprises: sequentially selecting the m WLs to be tested from the test group according to an arrangement sequence of the WLs, sequentially setting one of the m WLs to be tested as the first WL according to the arrangement sequence of the WLs, and then performing the first write operation, the second write operation and the read and determination operation till each of the 2 m*n WLs has been set as the first WL.

19. The defect detecting device for a WL driving circuit of claim 18, wherein the processor is configured to execute the processor-executable instructions to further perform an operation of:

sequentially selecting every 2 m*n continuously arranged WLs from the memory cell array according to the arrangement sequence of the WLs to serve as the test group, and then testing the test group till all the WLs in the memory cell array have been selected into the test group.

20. The defect detecting device for a WL driving circuit of claim 14, wherein the number m of the selected WLs to be tested is 16, and the number n of the WLs correspondingly connected to each WL driving circuit is 4.

* * * * *